(12) United States Patent
Kitagawa et al.

(10) Patent No.: US 6,916,678 B2
(45) Date of Patent: Jul. 12, 2005

(54) SURFACE MODIFICATION METHOD

(75) Inventors: Hideo Kitagawa, Ibaraki (JP);
Nobumasa Suzuki, Ibaraki (JP);
Shinzo Uchiyama, Ibaraki (JP)

(73) Assignee: Canon Kabushiki Kaisha, Tokyo (JP)

(*) Notice: Subject to any disclaimer, the term of this patent is extended or adjusted under 35 U.S.C. 154(b) by 63 days.

(21) Appl. No.: 10/701,431

(22) Filed: Nov. 6, 2003

(65) Prior Publication Data
US 2004/0102053 A1 May 27, 2004

(30) Foreign Application Priority Data
Nov. 27, 2002 (JP) ........................................ 2002-343855

(51) Int. Cl.[7] .............................................. H01L 21/00
(52) U.S. Cl. ........................................................ 438/58
(58) Field of Search ................................ 438/776, 541, 438/487, 424, 149, 58; 427/535; 118/732 R

(56) References Cited
U.S. PATENT DOCUMENTS

| 5,681,394 A | 10/1997 | Suzuki | 118/723 |
| 6,110,842 A | 8/2000 | Okuno et al. | 438/776 |
| 6,482,476 B1 * | 11/2002 | Liu | 427/535 |

FOREIGN PATENT DOCUMENTS

| JP | 6-140392 | 5/1994 |
| JP | 10-173187 | 6/1998 |

OTHER PUBLICATIONS

M. Arai et al., "The origin of the increase of hole trapping due to nitridation of silicon oxide", 62nd Japan Society of Applied Physics, Annual Meeting, Preprint, No. 2, p. 630, 12a–C–9.

K. Sasada et al., "Low Temperature Formation of Ultra Thin Gate Oxynitride Films Utilizing Activated Oxygen/Nitrogen," 62nd Japan Society of Applied Physics, Annual Meeting, Preprint, No. 2, p. 631, 12a–C–10.

* cited by examiner

Primary Examiner—Craig A. Thompson
Assistant Examiner—Monica D. Harrison
(74) Attorney, Agent, or Firm—Fitzpatrick, Cella, Harper & Scinto

(57) ABSTRACT

A method for modifying a surface of a substrate to be processed, by utilizing plasma includes the steps of adjusting a temperature of the substrate from 200° C. to 400° C., introducing gas including nitrogen atoms or mixture gas including inert gas and the gas including nitrogen atoms into a plasma process chamber, adjusting pressure in the plasma process chamber above 13.3 Pa, generating plasma in the plasma process chamber, and injecting ions equal to or smaller than 10 eV in the plasma into the substrate to be processed.

8 Claims, 8 Drawing Sheets

SURFACE MODIFICATION METHOD

This application claims a benefit of priority based on Japanese Patent Application No. 2002-343855, filed on Nov. 27, 2002, which is hereby incorporated by reference herein in its entirety as if fully set forth herein.

BACKGROUND OF THE INVENTION

The present invention relates generally to semiconductor manufacture methods, and more particularly to a method that provides high-quality and quick modification to a substrate to be processed, by utilizing microwave surface-wave plasma. The present invention is suitable, for example, for a method for forming a silicon oxynitride film.

Along with recent fine processing of semiconductor devices, a silicon oxynitride film has been applied in a gate insulating film with a thickness below 3 nm. A silicon oxynitride film is made by introducing nitrogen into a silicon oxide film. The silicon oxynitride film has attracted attention due to its excellent characteristics such as high specific permittivity, leak current prevention, and boron diffusion prevention from a gate electrode.

While the method for manufacturing a silicon oxynitride film includes a method for forming a film of a silicon thermal oxide film first and then introducing nitrogen, and a method for forming a silicon oxynitride film directly on a silicon substrate using a CVD (chemical vapor deposition) method, the former is promising viewed from electric characteristics of an interface with a silicon substrate. In addition, a heat treatment, a plasma process, etc. have been studied as a nitriding process to the silicon oxide film.

One proposed method for making a silicon oxynitride film which utilizes a heat treatment, for example, heats up a wafer under nitrogen monoxide gas atmosphere for several hours (62nd Japan Society of Applied Physics, Annual Meeting, Preprint, No. 2, page 630) so as to thermally nitride a silicon oxide film. Thermal nitriding needs such high temperature as 800° C. to 1000° C., so that nitrogen easily moves in a silicon oxide film and reaches an interface between the silicon oxide film and silicon. Since diffusion differs between the silicon oxidation film and silicon, nitrogen accumulates in the interface of the silicon oxide film and silicon. Thus, a nitrogen concentration distribution in a depth direction in the silicon oxide film as a result of thermal nitriding does not locate nitrogen on a surface, and causes increased nitrogen concentration in the interface between silicon and the silicon oxide film. Another example for making a silicon oxynitride film which utilizes a heat treatment is a nitriding method using $NH_3$, as disclosed in Japanese Patent Publication No. 6-140392.

One proposed method for making a silicon oxynitride film which utilizes the plasma process use remote plasma to sufficiently decrease nitrogen ions in nitrogen plasma, transports only nitrogen active species, and nitrides a silicon oxide film (62nd Japan Society of Applied physics, Annual Meeting, Preprint, No. 2, page 631). This method uses reactive neutral active species to nitride a silicon oxide film at comparatively low temperature of about 400° C. It decreases nitrogen ions in nitrogen plasma and uses only nitrogen active species by maintaining a reactor at a high pressure, and spacing plasma generation part from a wafer. The remote plasma process exhibits a large nitrogen concentration distribution in a depth direction in a silicon oxide film near the surface, and small one at the interface between silicon and a silicon oxide film.

A nitriding method that uses ions from plasma has also be known, as disclosed in Japanese Patent Publication No. 10-173187. This method injects ions with energy below 50 eV, and may obtain a nitrogen concentration distribution in a depth direction that has a peak at a depth dependent upon the ion energy.

These conventional methods for nitriding a silicon oxide film have several disadvantages and have not yet been reduced to practice.

For example, the heat nitriding process has a high nitrogen concentration at the interface of a silicon oxide film and silicon, and causes inferior device characteristics, such as low mobility of a channel in a transistor.

On the other hand, the remote plasma process cannot obtain sufficient nitrogen active species since necessary nitrogen active species decreased with the nitrogen ions in the plasma, and takes a very long process time. In addition, this process cannot enhance the nitrogen surface density since the nitrogen concentration distribution in a depth direction in the silicon oxide film decreases drastically by depth. An introduction of a sufficient amount of nitrogen would need a high temperature, disperse nitrogen deeply, and cannot form a shallow nitrided layer.

The nitriding process using ions at low pressure and temperature leaves damages in a silicon thermal oxide film, deteriorates performance in leak current and boron dispersion prevention. Damages recover at high temperature, but nitrogen disperses in a high temperature process and a shallow nitride layer cannot be obtained. In addition, when ions are implanted with high energy of several tens of eV, ions are injected down to a deep position and cannot nitride an extremely thin oxide film below 3 nm.

BRIEF SUMMARY OF THE INVENTION

Accordingly, it is an exemplary object of the present invention to provide a surface modification method, which eliminates the above prior art disadvantages, and provides a rapid surface modification that generates by a less damaged, high-quality oxynitride film sufficiently reducing a nitrogen concentration at an interface between a silicon oxide film and a silicon substrate while increasing a nitrogen concentration in a silicon oxide film.

A method of one aspect according to the present invention for modifying a surface of a substrate to be processed, by utilizing plasma includes the steps of adjusting a temperature of the substrate from 200° C. to 400° C., introducing gas including nitrogen atoms or mixture gas including inert gas and the gas including nitrogen atoms into a plasma process chamber, adjusting pressure in the plasma process chamber above 13.3 Pa, generating plasma in the plasma process chamber, and injecting ions equal to or smaller than 10 eV in the plasma into the substrate to be processed.

The temperature adjusting step may adjust the temperature of the substrate from 200° C. to 300° C. The introducing step may introduce $N_2$, $NH_3$ or $N_2H_4$ as the gas including nitrogen atoms and/or He, Ne, Ar, Kr, and Xe as the inert gas. The pressure adjusting step may adjust the pressure between 26.6 Pa and 39.9 Pa. The injecting step may inject the ion with an average value of ion energy equal to or smaller than 7 eV. The generating step may generate as the plasma surface-wave plasma, surface-wave interference plasma, or RLSA plasma. The surface of the substrate to be processed may be a surface of a MOSFET gate insulating film.

DETAILED DESCRIPTION OF THE PREFERRED EMBODIMENTS

Figure 1:
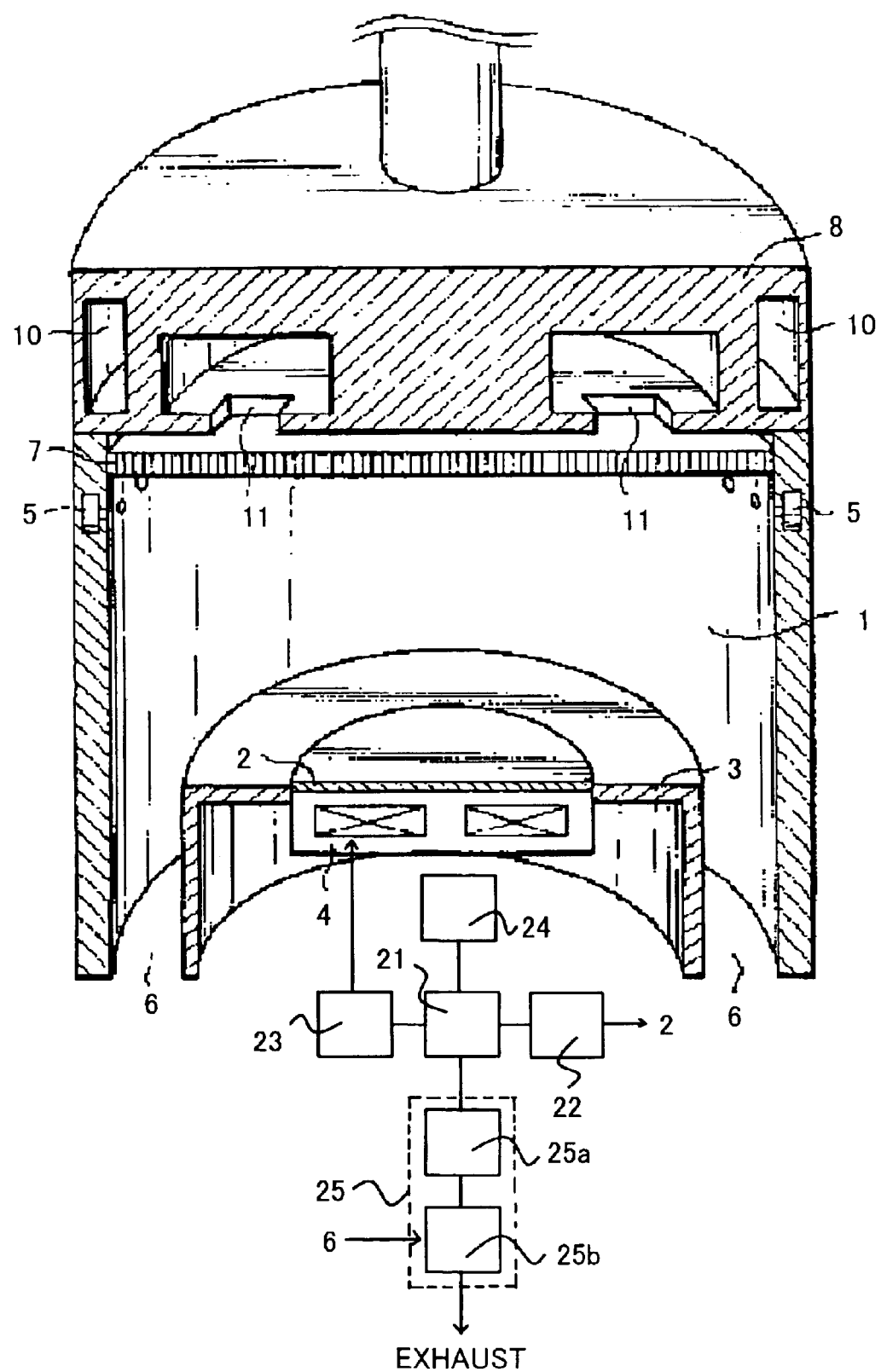
FIG. 1 is a schematic sectional perspective view of a microwave surface-wave interference plasma processing apparatus as one embodiment according to the present invention.

A description will be given of a microwave surface-wave interference plasma processing apparatus of a first embodiment according to the present invention, with reference to FIG. 1. In FIG. 1, 1 is a plasma processing chamber, 2 is a substrate to be processed, 3 is a substrate stage for holding the substrate 2, 4 is a heater, 5 is a process gas introducing means, 6 is an exhaust opening, 8 is a slot-cum non-terminal circle waveguide for introducing microwaves to the plasma process chamber 1, 11 is a slot provided in the slot-cum non-terminal circle waveguide 8 for each ½ or ¼ times a wavelength of an in-tube microwave, 7 is a dielectric window for introducing microwaves to the plasma process chamber 1, and 10 is a cooling channel installed in the slot-cum non-terminal circle waveguide 8. An inner wall of the plasma process chamber 1 and the dielectric window are made of quartz to prevent metallic contamination to the substrate 2. The substrate stage 3 is made of ceramic composed mainly of aluminum nitride for balance between heat conduction and metallic contamination.

In plasma processing, cooling water flows through the cooling channel 10 and cools the slot-cum non-terminal circle waveguide 8 down to the room temperature. The heater 4 heats up the substrate stage 3. The substrate 2 that forms a silicon oxide film having a thickness of 3 nm or smaller on its surface is fed to and placed on the stage 3. The substrate 2 may be fed in the vacuum atmosphere using a load lock chamber (not shown) or in a nitrogen or inert gas atmosphere under the air pressure.

Next, the plasma process chamber 1 is vacuum-exhausted by an exhaust system 25 that includes a pressure regulating valve 25a and a vacuum pump 25b manufactured, for example, by Kashiyama Industry Co. Ltd., which are known in the art. The controller 21 adjusts the pressure of the plasma process chamber 1 by controlling the pressure regulating valve 25a, such as a VAT Vakuumventile A.G. ("VAT") manufactured gate valve that has a pressure regulating function and an MKS Instruments, Inc. ("MKS") manufactured exhaust slot valve, so that the pressure sensor 24 for detecting the pressure of the process chamber 1 exhibits a predetermined value, while driving the vacuum pump 25b.

Figure 8:
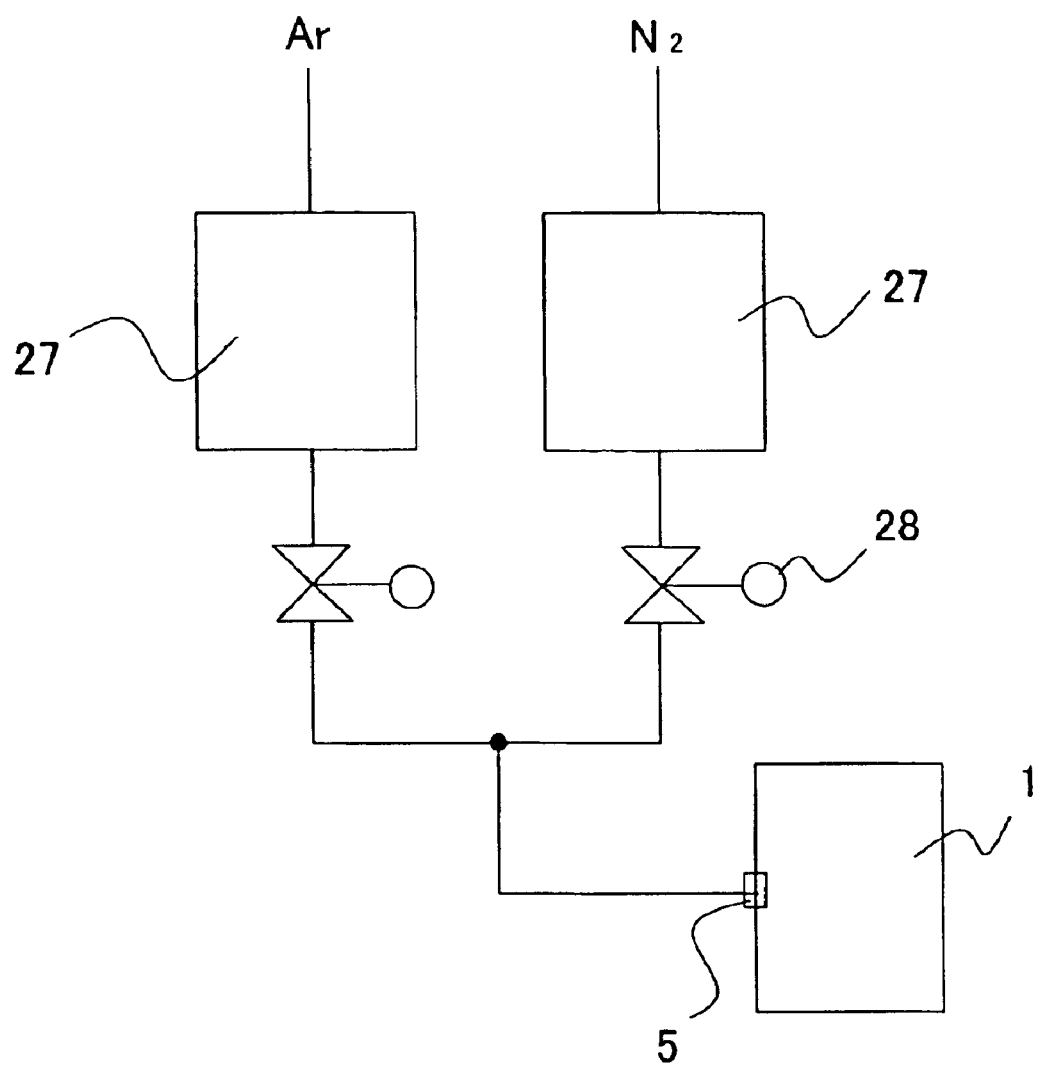
FIG. 8 is a schematic block diagram of a gas mixture ratio control mechanism applicable to the microwave surface-wave interference plasma processing apparatus shown in FIG. 1.

Then, gas that contains nitrogen, such as $N_2$, NO, $NO_2$, $NH_3$ and $N_2H_4$, or mixture gas including the gas that contains nitrogen and inert gas, such as He, Ne, Ar, Xe, and Kr is introduced to the plasma process chamber 1 through the process gas introducing means 5. The process gas introducing means 5 includes, as shown in FIG. 8, in addition to a gas source and a supply channel, a mass adjustment valve etc. known in the art, to introduce the desired flow to the process chamber 1. In other words, the flow rate of inert gas and nitrogen gas may be regulated using a mass flow controller 27, as manufactured by MKS, which is connected to the controller 21 and controls the mass flow of the gas, and a valve 28 for stopping supplying gas to the plasma process chamber 1. The controller 21 supplies gas of a desired mixture ratio to the plasma process chamber 1 by directing the desired mass flow to the mass flow controller 27. Alternatively, it closes the valve 28 when not flowing gas at all. The insert gas is not reactive and thus does not negatively affect the silicon oxide film. In addition, it is easily ionized, increases the plasma density, and fastens the nitriding process speed.

Then, the pressure regulating valve 25a, such as a conductance valve, provided in the exhaust system 25 is regulated so as to hold the pressure in the plasma process chamber 1 to the constant pressure.

Then, the microwave power supply supplies the plasma process chamber 1 with microwaves through the slot-cum non-terminal circle waveguide 8 and dielectric window 7, thereby generating plasma in the plasma process chamber 1. Microwaves introduced in the slot-cum non-terminal circle waveguide 8 are distributed to left and right sides, and transmit with an in-tube wavelength longer than that in the free space. They are introduced into the plasma process chamber 1 via the dielectric window through the slot 11, and transmit as a surface wave on the surface of the dielectric window 7. This surface wave interferes between adjacent slots, and forms an electric field, which generates plasma. The plasma generation part has high electron temperature and electron density, and may effectively isolate nitrogen. The electron temperature rapidly lowers as a distance from the plasma generation part increases. Nitrogen ions in the plasma are transported to and near the substrate 2 through diffusion, and accelerated by ion sheath and collide with the substrate 2. After a predetermined time period elapses, the microwave power supply stops and supply of nitrogen gas stops. After the plasma process chamber 1 is vacuum-exhausted, the substrate 2 is fed outside the plasma process chamber 1. The temperature of the substrate 2 has been heated by plasma above the initial temperature. The temperature rise is determined by ion energy and the number of ions incident upon the substrate.

A method for dispersing sheet-shaped plasma downstream with ultra high density is the best to achieve the extremely low sheath voltage below 10 V and maintain the plasma density to a practical value. The plasma source best suitable for the instant method is microwave surface-wave plasma, specifically surface-wave plasma, surface-wave interference plasma, RLSA plasma, etc., but other plasma sources, such as microwave plasma, inductively coupled plasma, capacitively coupled plasma, magnetron plasma, ECR plasma, and NLD plasma are applicable to the present invention as long as the sheath potential below 10 eV and practical plasma density are available.

The ion energy may be adjusted by pressure and a plasma generation method. For example, as the pressure increases, the ion energy decreases; as the pressure decreases, the ion energy increases. In general, the ion energy tends to lower as the high frequency for generating plasma rises. For example, it is reported that the commercially available apparatus achieves incident ion energy of 10 to 20 V using the above inductively or capacitively coupled plasma. Use of such plasma sources would result in a deep intrusion of nitrogen and cannot obtain a gate insulating film having good characteristics.

As a result of an analysis of a silicon oxide film nitrided by the above apparatus, several pieces of information were obtained. The result will be discussed in detailed below.

Figure 2:
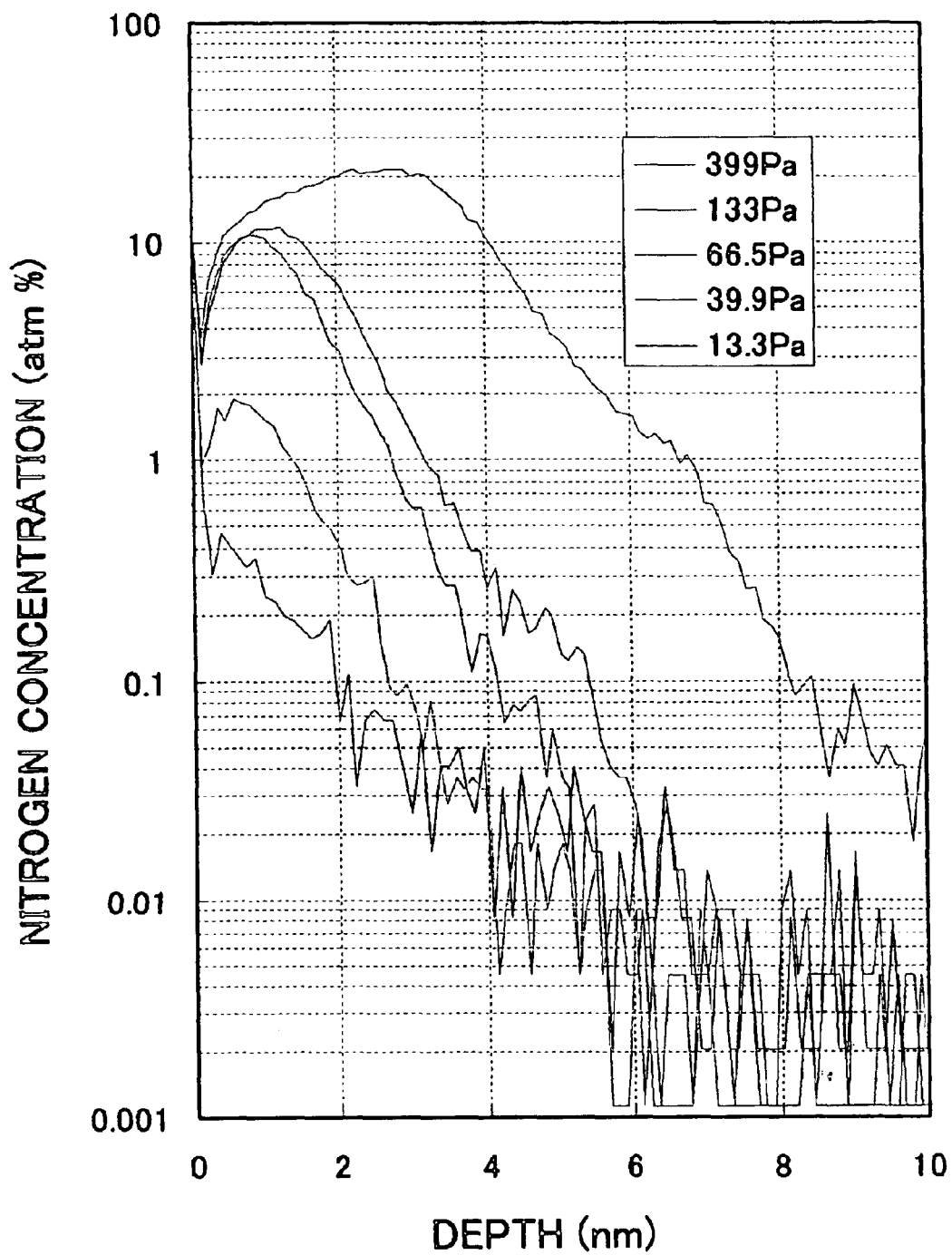
FIG. 2 is a graph showing a nitrogen concentration distribution in a depth direction in a silicon oxide film formed on a substrate to be processed.

When SIMS measured the process pressure dependency of the nitrogen concentration in the silicon oxide film on the surface of the subject, it was found that the nitrided depth and the nitrided amount depend upon the pressure as shown in FIG. 2. A color version of FIG. 2 is attached to the instant application for better understanding.

Figure 3:
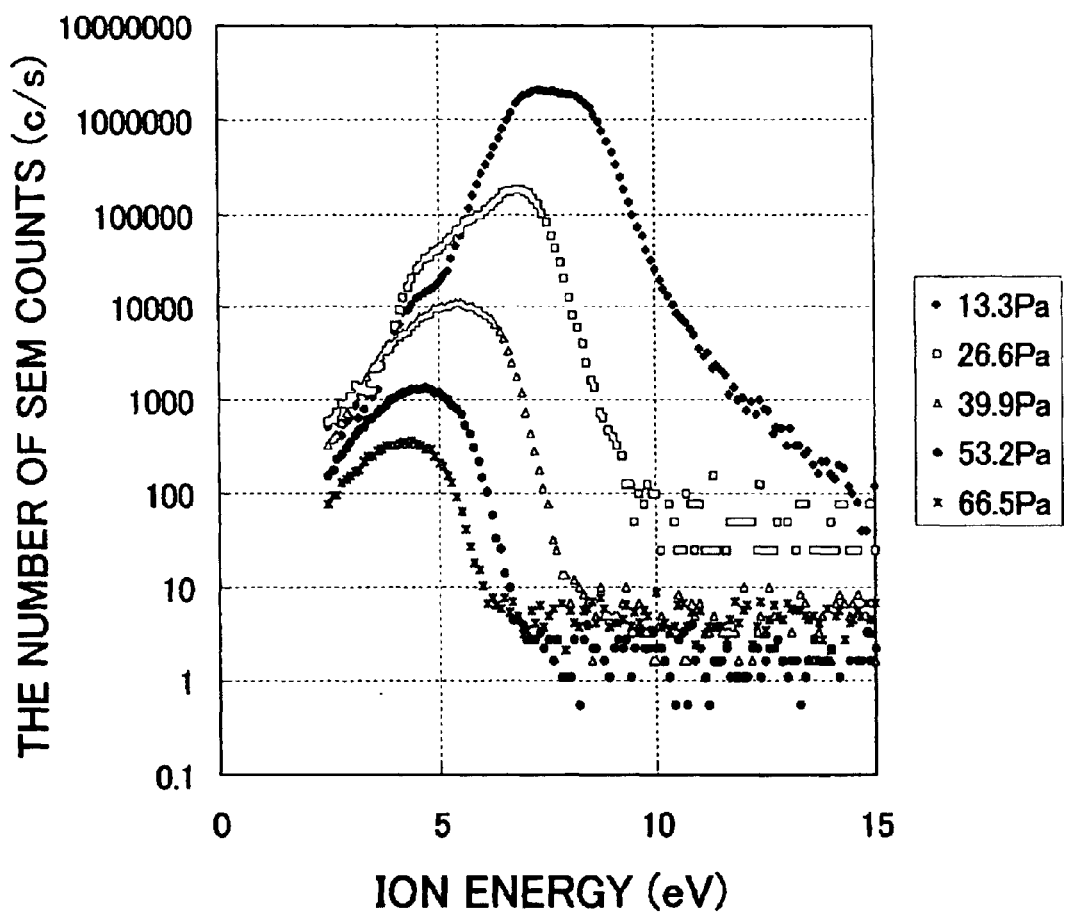
FIG. 3 is a graph showing a pressure dependency of ion energy distribution incident upon the substrate to be processed.

FIG. 3 shows a result of measured pressure dependency of the ion energy incident upon the substrate using the same apparatus. Similar to FIG. 2, a color version of FIG. 3 is attached to the instant application for better understanding. It is understood from FIG. 3 the distribution shifts towards the low energy side as the pressure increases, and the incident ion amount lowers, corresponding to a SIMS result shown in FIG. 2. In other words, it may be concluded that the instant method nitrides the silicon oxide film by the injection of nitrogen ions. While the ion energy of 13.3 Pa greatly distorts and includes a large amount of high energy component, the nitrogen concentration distribution proportionally contains a large amount of greatly distorted and deeply injected component. When the pressure is above 39.9 Pa, the high energy component extinguishes in the incident ion energy distribution. It is considered that this is because the high pressure shortens the mean free path and high energy particles generated in the plasma generation part lose their energy due to collisions.

FIG. 3 shows a graph of the incident ion energy distribution as a measurement result to 13.3 Pa. The gate insulating film processed at 13.3 Pa tends to slightly deteriorate. An average value of the incident ion energy at that time is 7 eV, and most of the distribution is within 10 eV, although it is observed that some part of ions is incident at energy above 10 eV. As the pressure rises, ions above 10 eV decrease and the film characteristic becomes better accordingly.

As clarified by FIG. 3, for the pressure of 26.6 Pa, the high energy component of ions decreases as the pressure rises. The energy component slightly remains above 10 eV for the pressure of 13.3 Pa, while the component of 10 eV or higher lowers below the detectable limit for the pressure of 26.6 Pa or higher. From this fact, the pressure of 26.6 Pa or higher would be preferable.

Figure 4:
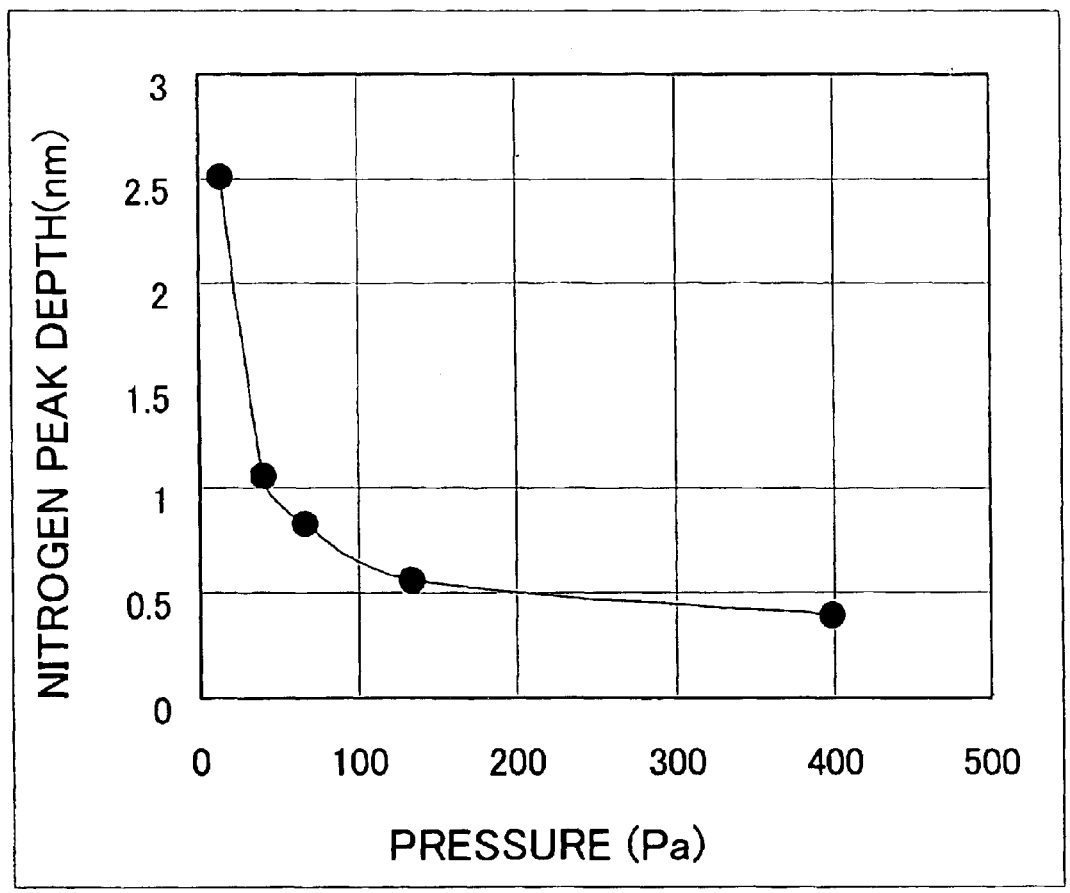
FIG. 4 is a graph showing a relationship between pressure and a peak depth in a nitrogen concentration distribution.

FIG. 4 shows a graph showing plotted maximum depths of the nitrogen concentration to pressure. The maximum depth of the nitrogen concentration becomes shallow up to about 0.4 nm at the process pressure of 399 Pa, and it is possible to maintain low the nitrogen concentration at the interface between silicon and the silicon oxide film even in the gate oxide film having a thickness of about 1 nm. In addition, the low pressure condition is applicable to the thick film. The stable surface-wave plasma discharge cannot be maintained at the pressure of 399 Pa or higher.

Figure 5:
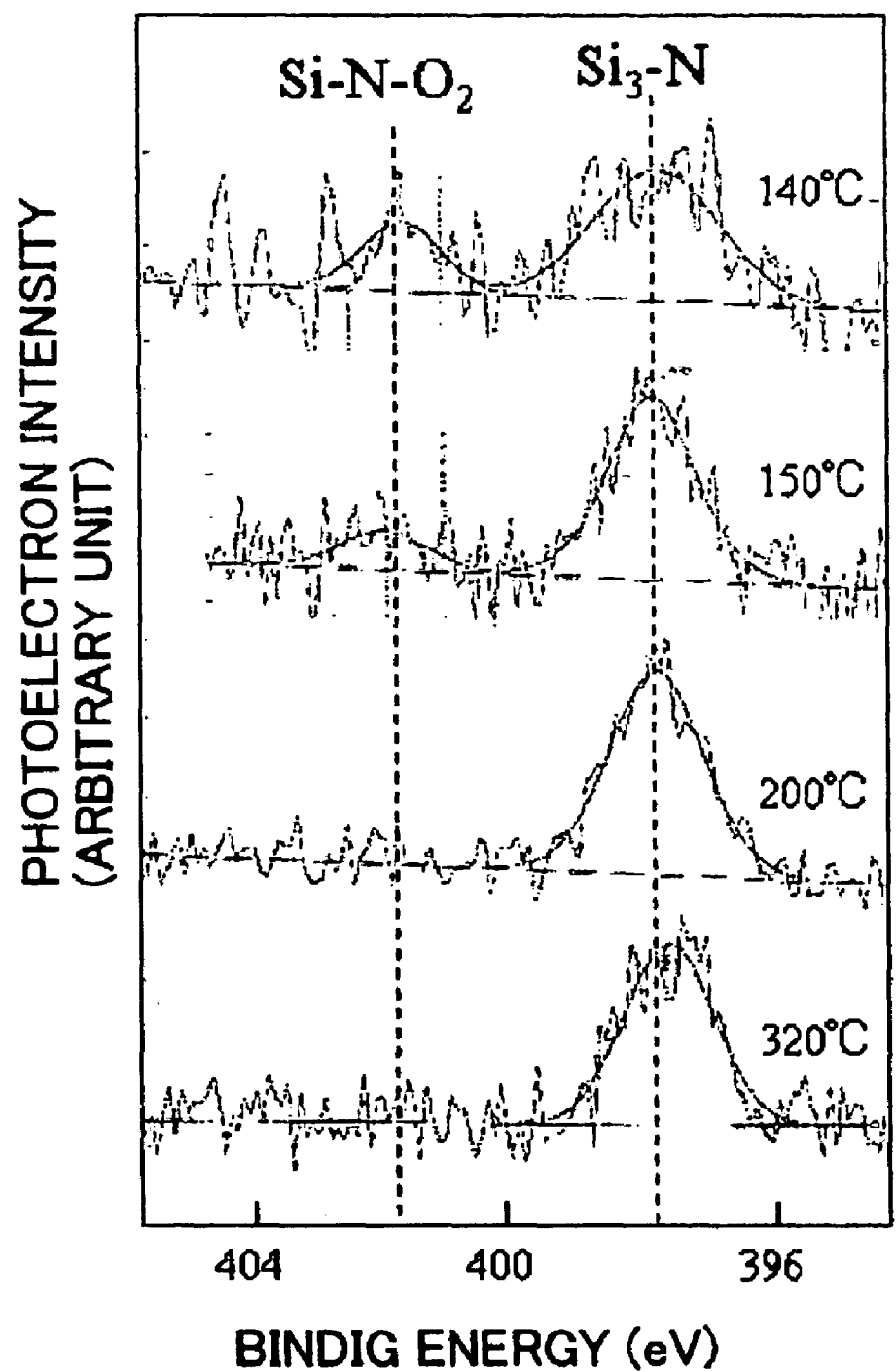
FIG. 5 is a graph showing XPS measured changes of an N1s peak depending upon a substrate temperature.

FIG. 5 shows a result of XPS investigated temperature dependency of binding stages of nitrogen atoms in the substrate. Here, a color version of FIG. 5 is attached to the instant application for better understanding. When the substrate temperature is 200° C. or lower, two bonding states of Si—N—$O_2$ and $Si_3$—N are observed in the is spectrum of nitrogen and a peak of $Si_3$—N becomes wide. On the other hand, when the substrate temperature is 200° C. or lower, a bonding state of $Si_3$—N is observed and a peak of $Si_3$—N becomes narrow. The $Si_3$—N bonding is a bonding state observed in $Si_3N_4$ as perfect nitride, which stably bonds nitrogen and silicon. On the other hand, it is considered that the Si—N—$O_2$ bonding is an instable bonding state that is generated by cutting the Si—O bonding in $SiO_2$ by N, as damaged by incident ions. A $Si_3$—N peak width at the temperature of 200° C. or lower reflects disturbance in a crystalline state due to incident ions. The above results reveal that the damages introduced by incident nitrogen ions are recoverable by a process at the temperature of 200° C. or higher.

A description will now be given of diffusion of nitrogen. According to the experiments by the instant inventors, it was found that the dispersion active energy of nitrogen atoms in the silicon oxide film is 0.7 to 2 eV although it depends upon the film quality of the silicon oxide film. In other words, although it depends upon the nitrogen concentration gradient in the silicon oxide film and the process time, the dispersion is almost negligible when the temperature of the substrate 2 is maintained to be approximately 400° C. or lower. More preferably, it was found that when the temperature of the substrate 2 is maintained to be approximately 300° C. or lower, nitrogen injected into the silicon oxide film stays there.

As a result, nitrogen does not disperse in the silicon oxide film and an anneal effect may be obtained by maintaining the temperature of the substrate 2 between 200° C. and 400° C. Since the substrate 2 is heated up by the heater 4 and irradiation of nitrogen ions, it is necessary to properly set the temperature of the substrate 2 before the nitriding process so that the temperature of the substrate 2 may be between 200° C. and 400° C. at the end of nitriding process.

The temperature of the substrate 2 may be measured directly (for example, by a direct contact with a thermocouple, etc.) or indirectly (for example, by a thermometer embedded in the stage 3 to measure the temperature of the stage 3 or by radiant heat from the substrate 2 to reflect its temperature). The present invention does not preclude the thermometer to use the thermocouple that directly contacts the substrate 2 and measures its temperature, but the direct contact generally might cause contamination. The temperature control mechanism includes the controller 21, a thermometer 22, (heater lines of) the heater 4, and a power supply 23 connected to the controller 21. The controller 21 controls electrification to the heater 4 so that the temperature of the substrate 2 becomes between 200° C. and 400° C.

Since the pressure of 13.3 Pa or lower would nitride the substrate deeply with existence of high energy ions, higher pressure would be preferable.

First Embodiment

A description will now be given of a second embodiment according to the present invention, using a microwave surface-wave interference plasma processing apparatus shown in FIG. 1. First, the heater 4 heats the substrate stage 3 up to 200° C., and the substrate 2 that forms a silicon oxide film having a thickness of 2 nm on its surface is fed to and placed on the stage 3. Next, the plasma process chamber 1 is vacuum-exhausted by the exhaust system 25 down to 1 Pa. Then, nitrogen gas is introduced into the plasma process chamber 1 at 500 sccm through the process gas introducing means 5. Then, the pressure regulating valve 25a, such as a conductance valve, provided in the exhaust system 25 is regulated so as to hold the pressure in the plasma process chamber 1 to 133 Pa.

Then, the microwave power supply (not shown) supplies the plasma process chamber 1 with microwaves of 1.5 kW through the slot-cum non-terminal circle waveguide 8 and dielectric window 7, thereby generating plasma in the plasma process chamber 1. After three minutes pass, the microwave power supply stops and supply of nitrogen gas stops. After the plasma process chamber 1 is vacuum-exhausted below 1 Pa, the substrate 2 is fed outside the plasma process chamber 1. The temperature of the substrate 2 has been heated up by plasma, but the temperature was below 270° C.

According to the SIMS measurement, the nitrogen concentration in the silicon oxide film on the surface of the substrate 2 has a peak at a depth of 0.5 nm, drastically reduces from there, and exhibited 0.4 atm % or less at an interface between the silicon oxide film and silicon at a depth of 2 nm. According to the SIMS measurement principle, the actual nitrogen concentration at the interface between the silicon oxide film and silicon is considered to be lower than this value. According to the XPS measurement, the nitrogen concentration increases up to about 5 atm %, and only the $Si_3$—N bonding is observed for the bonding state of nitrogen. According to the measurement using an ellipsometer, optical oxide film converted thickness is 2.1 nm and its uniformity is 3.0%.

Second Embodiment

A description will now be given of a second embodiment according to the present invention, using a microwave surface-wave interference plasma processing apparatus shown in FIG. 1. First, the heater 4 heats the substrate stage 3 up to 200° C., and the substrate 2 that forms a silicon oxide film having a thickness of 2 nm on its surface is fed to and placed on the stage 3. Next, the plasma process chamber 1 is vacuum-exhausted by the exhaust system 25 down to 1 Pa. Then, nitrogen gas is introduced into the plasma process chamber 1 at 500 sccm through the process gas introducing means 5. Then, the pressure regulating valve 25a, such as a conductance valve, provided in the exhaust system 25 is regulated so as to hold the pressure in the plasma process chamber 1 to 26.6 Pa.

Then, the microwave power supply (not shown) supplies the plasma process chamber 1 with microwaves of 1.5 kW through the slot-cum non-terminal circle waveguide 8 and dielectric window 7, thereby generating plasma in the plasma process chamber 1. Fifteen seconds later, the microwave power supply stops and supply of nitrogen gas stops. After the plasma process chamber 1 is vacuum-exhausted below 1 Pa, the substrate 2 is fed outside the plasma process chamber 1. The temperature of the substrate 2 has been heated up by plasma, but the temperature was below 300° C.

According to the SIMS measurement, the nitrogen concentration in the silicon oxide film on the surface of the substrate 2 has a peak at a depth of 0.7 nm, drastically reduces from there, and exhibited 1 atm % or less at an interface between the silicon oxide film and silicon at a depth of 2 nm. According to the SIMS measurement principle, the actual nitrogen concentration at the interface between the silicon oxide film and silicon is considered to be lower than this value. According to the XPS measurement, the nitrogen concentration increased up to about 5 atm %, and only the $Si_3$—N bonding was observed for the bonding state of nitrogen. According to the measurement using an ellipsometer, optical oxide film converted thickness was 2.5 nm and its uniformity was 3.5%.

Third Embodiment

A description will now be given of a third embodiment according to the present invention, using a microwave surface-wave interference plasma processing apparatus shown in FIG. 1. The instant embodiment has an object to provide an effective and quick nitride process by adding inert gas to gas that contains nitrogen, and raising the plasma density by 2 to 3 times.

The plasma process is conducted using microwave surface-wave interference plasma processing apparatus shown in FIG. 1 as follows: First, the heater 4 heats the substrate stage 3 up to 150° C., and the substrate 2 that forms a silicon oxide film having a thickness of 2 nm on its surface is fed to and placed on the stage 3. Next, the plasma process chamber 1 is vacuum-exhausted by the exhaust system 25 down to 1 Pa. Then, nitrogen gas of 50 sccm and argon of 450 sccm are introduced into the plasma process chamber 1 through the process gas introducing means 5. Then, the pressure regulating valve 25a, such as a conductance valve, provided in the exhaust system 25 is regulated so as to hold the pressure in the plasma process chamber 1 to 133 Pa.

Then, the microwave power supply (not shown) supplies the plasma process chamber 1 with microwaves of 1.5 kW through the slot-cum non-terminal circle waveguide 8 and dielectric window 7, thereby generating plasma in the plasma process chamber 1. Three minutes later, the microwave power supply stops and supply of nitrogen gas and argon gas stops. After the plasma process chamber 1 is vacuum-exhausted below 1 Pa, the substrate 2 is fed outside the plasma process chamber 1. The temperature of the substrate 2 has been heated up by plasma, but the temperature was below 280° C.

According to the SIMS measurement, the nitrogen concentration in the silicon oxide film on the surface of the substrate 2 has a peak at a depth of 0.5 nm, drastically reduces from there, and exhibited 0.5 atm % or less at an interface between the silicon oxide film and silicon at a depth of 2 nm. According to the SIMS measurement principle, the actual nitrogen concentration at the interface between the silicon oxide film and silicon is considered to be lower than this value. According to the XPS measurement, the nitrogen concentration increased up to about 9 atm %, and only the $Si_3$—N bonding was observed for the bonding state of nitrogen. According to the measurement using an ellipsometer, optical oxide film converted thickness was 2.2 nm and its uniformity was 2.7%.

Fourth Embodiment

A description will now be given of a fourth embodiment according to the present invention, using a microwave surface-wave interference plasma processing apparatus shown in FIG. 1. The instant embodiment has an object to provide an effective and quick nitride process by enlarging microwave power and raising the plasma density by 2 to 3 times.

The plasma process is conducted using microwave surface-wave interference plasma processing apparatus shown in FIG. 1 as follows: First, the heater 4 heats the substrate stage 3 up to 150° C., and the substrate 2 that forms a silicon oxide film having a thickness of 2 nm on its surface is fed to and placed on the stage 3. Next, the plasma process chamber 1 is vacuum-exhausted by the exhaust system 25 down to 1 Pa. Then, nitrogen gas of 500 sccm is introduced into the plasma process chamber 1 through the process gas introducing means 5. Then, the pressure regulating valve 25a, such as a conductance valve, provided in the exhaust system 25 is regulated so as to hold the pressure in the plasma process chamber 1 to 133 Pa.

Then, the microwave power supply (not shown) supplies the plasma process chamber 1 with microwaves of 3.0 kW through the slot-cum non-terminal circle waveguide 8 and dielectric window 7, thereby generating plasma in the plasma process chamber 1. Three minutes later, the microwave power supply stops and supply of nitrogen gas stops. After the plasma process chamber 1 is vacuum-exhausted below 1 Pa, the substrate 2 is fed outside the plasma process chamber 1. The temperature of the substrate 2 has been heated up by plasma, but the temperature was below 270° C.

According to the SIMS measurement, the nitrogen concentration in the silicon oxide film on the surface of the substrate 2 has a peak at a depth of 0.5 nm, drastically reduces from there, and exhibited 0.5 atm % or less at an interface between the silicon oxide film and silicon at a depth of 2 nm. According to the SIMS measurement principle, the actual nitrogen concentration at the interface between the silicon oxide film and silicon is considered to be lower than this value. According to the XPS measurement, the nitrogen concentration increased up to about 8 atm %, and only the $Si_3$—N bonding was observed for the bonding state of nitrogen. According to the measurement using an ellipsometer, optical oxide film converted thickness was 2.2 nm and its uniformity was 3.8%.

Fifth Embodiment

A description will now be given of a fifth embodiment according to the present invention, using a microwave surface-wave interference plasma processing apparatus shown in FIG. 1. The instant embodiment has an object to provide an effective and quick nitride process by approaching the substrate stage 3 to plasma and raising the plasma density without substantially changing the plasma electron temperature.

The plasma process is conducted using microwave surface-wave interference plasma processing apparatus shown in FIG. 1 as follows: First, the heater 4 heats the substrate stage 3 up to 100° C., and the substrate 2 that forms a silicon oxide film having a thickness of 2 nm on its surface is fed to and placed on the stage 3. Then, the substrate stage 3 is moved to a position 5 cm above a feed position and 5 cm below the dielectric window 7.

Figure 7:
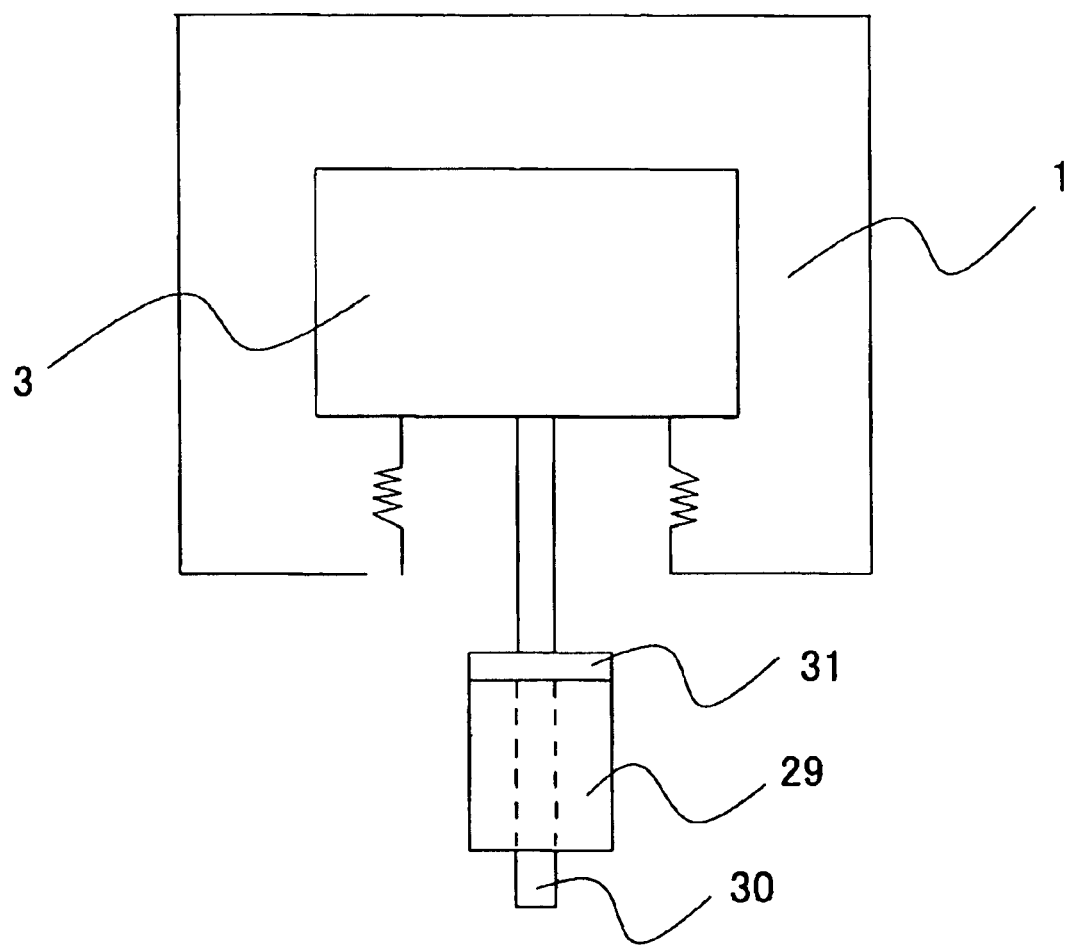
FIG. 7 is a schematic block diagram of an elevator mechanism of a stage applicable to the microwave surface-wave interference plasma processing apparatus shown in FIG. 1.

FIG. 7 shows one example of an elevator mechanism of the substrate stage 3. In FIG. 7, 29 is the elevator mechanism, connected to and controlled by the controller 21, for moving up and down the stage 3. 30 is a support rod fixed on the stage 3 and moved up and down by the elevator mechanism 29. 31 is a vertical position detector for detecting a position of the stage 3. The elevator mechanism 29 moves up and down the support rod 30 using a rotation of a gear attached to a pneumatic drive rotary machine (not shown). The vertical position detector may use, for example, a potentiometer known in the art. The controller 21 controls the elevator mechanism 29 so that a vertical position of the stage 3 detected by the vertical position detector 31 is a desired position.

Next, the plasma process chamber 1 is vacuum-exhausted by the exhaust system 25 down to 1 Pa. Then, nitrogen gas of 500 sccm is introduced into the plasma process chamber 1 through the process gas introducing means 5. Then, the pressure regulating valve 25a, such as a conductance valve, provided in the exhaust system 25 is regulated so as to hold the pressure in the plasma process chamber 1 to 133 Pa.

Then, the microwave power supply (not shown) supplies the plasma process chamber 1 with microwaves of 1.5 kW through the slot-cum non-terminal circle waveguide 8 and dielectric window 7, thereby generating plasma in the plasma process chamber 1. One minute later, the microwave power supply is stopped and supply of nitrogen stops. After the plasma process chamber 1 is vacuum-exhausted below 1 Pa, the substrate 2 is fed outside the plasma process chamber 1. The temperature of the substrate 2 has been heated up by plasma, but the temperature was below 210° C.

According to the SIMS measurement, the nitrogen concentration in the silicon oxide film on the surface of the substrate 2 has a peak at a depth of 0.6 nm, drastically reduces from there, and exhibited 0.5 atm % or less at an interface between the silicon oxide film and silicon at a depth of 2 nm. According to the SIMS measurement principle, the actual nitrogen concentration at the interface between the silicon oxide film and silicon is considered to be lower than this value. According to the XPS measurement, the nitrogen concentration increased up to about 7 atm %, and only the $Si_3$—N bonding was observed for the bonding state of nitrogen. According to the measurement using an ellipsometer, optical oxide film converted thickness was 2.1 nm and its uniformity was 5.6%.

Sixth Embodiment

Figure 6:
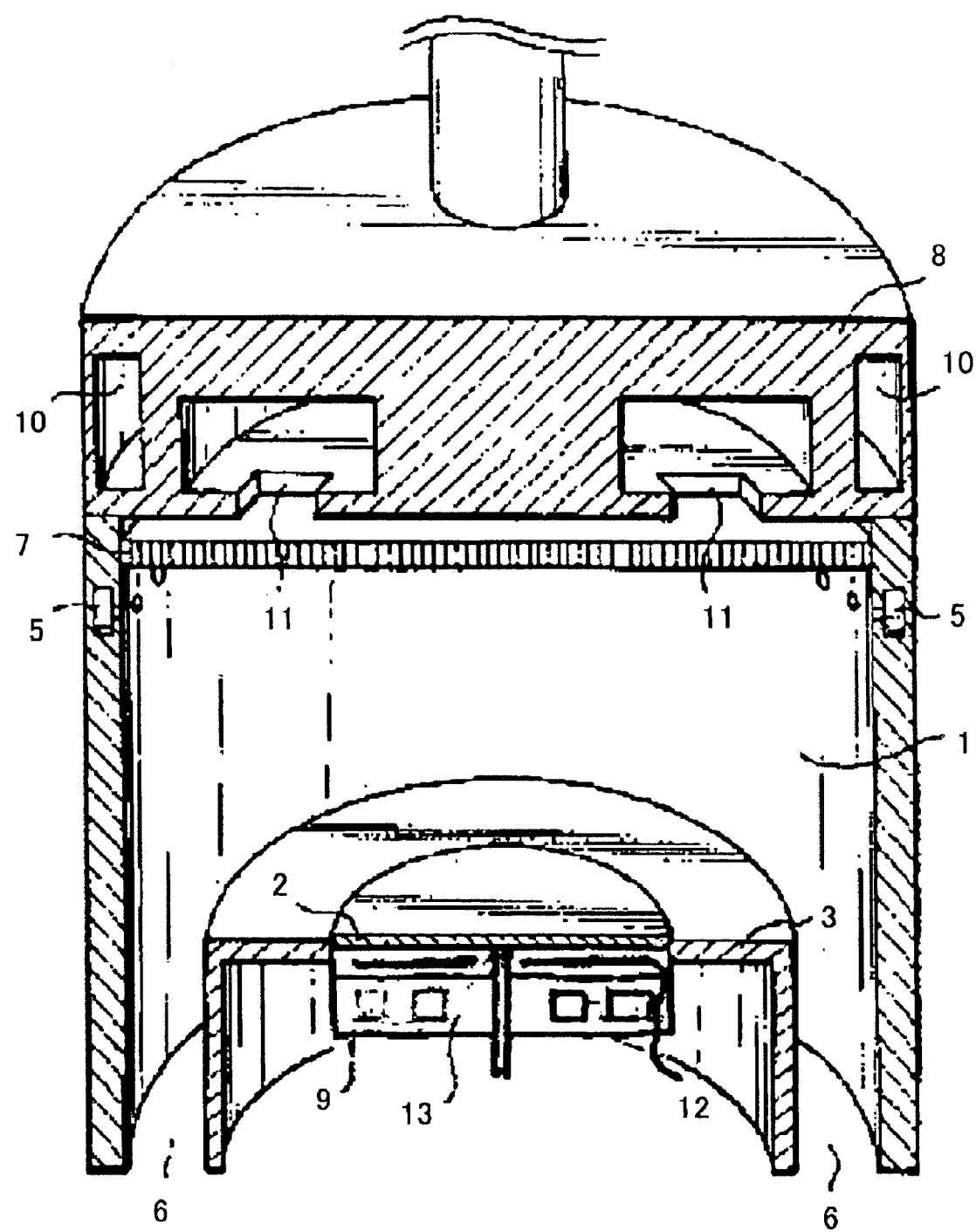
FIG. 6 is a schematic sectional perspective view of a variation of the microwave surface-wave interference plasma processing apparatus shown in FIG. 1.

A description will now be given of a sixth embodiment according to the present invention, using a microwave surface-wave interference plasma processing apparatus shown in FIG. 1. The instant embodiment provides the substrate stage 3 with a mechanism for controlling temperature of the substrate 2, and has an object to maintain a temperature of the substrate 2 to one which substantially prevents nitrogen from diffusing in the substrate 2, and provides an anneal effect by controlling temperature of the substrate 2 and mitigating temperature rise in the plasma processing. In FIG. 6, 9 is a heat material channel for controlling the temperature of the substrate stage 3. 12 is a dipole absorptive electrode that generates absorptive power between the substrate stage 3 and the substrate 2. A helium supply inlet 13 and a dent that is connected to it and has a depth of 100 μm are provided on the surface of the substrate stage 3. Other than that, those elements which are the same as corresponding elements in FIG. 1 are designated by the same reference numerals and a detailed description will be omitted.

The plasma process is conducted using microwave surface-wave interference plasma processing apparatus shown in FIG. 6 as follows: First, a heat material is flowed through the heat material channel 9 to maintain the substrate stage 3 at 200° C. Then, the substrate 2 that forms a silicon oxide film having a thickness of 2 nm on its surface is fed to and placed on the stage 3. Then, the voltage of ±200 V is applied to the dipole absorptive electrode 12 from the high voltage power supply (not shown) to absorb the substrate 2 onto the substrate stage 3.

Next, helium is filled in the dent in the surface of the stage 3 through the helium supply inlet 13. The pressure of helium is set to 800 Pa. Then, the substrate stage 3 is moved up to a position 5 cm below the dielectric window 7 using means (not shown).

Next, the plasma process chamber 1 is vacuum-exhausted by the exhaust system 25. Then, nitrogen gas is introduced into the plasma process chamber 1 at 500 sccm through the process gas introducing means 5. Then, the pressure regulating valve 25a, such as a conductance valve, provided in the exhaust system 25 is regulated so as to hold the pressure in the plasma process chamber 1 to 133 Pa.

Then, the microwave power supply (not shown) supplies the plasma process chamber 1 with microwaves of 1.5 kW through the slot-cum non-terminal circle waveguide 8 and dielectric window 7, thereby generating plasma in the plasma process chamber 1. Three minutes later, the microwave power supply is stopped and supply of nitrogen gas and helium gas is stopped. After the plasma process chamber 1 is vacuum-exhausted below 1 Pa, supply of the high voltage to the absorptive electrode 12 stops and the substrate 2 is fed outside the plasma process chamber 1. The temperature of the substrate 2 has been heated up by plasma, but the temperature was about 220° C.

According to the SIMS measurement, the nitrogen concentration in the silicon oxide film on the surface of the substrate 2 has a peak at a depth of 0.5 nm, drastically reduces from there, and exhibited 0.4 atm % or less at an interface between the silicon oxide film and silicon at a depth of 2 nm. According to the SIMS measurement principle, the actual nitrogen concentration at the interface between the silicon oxide film and silicon is considered to be lower than this value. According to the XPS measurement, the nitrogen concentration increased up to about 7 atm %, and only the $Si_3$—N bonding was observed for the bonding state of nitrogen. According to the measurement using an ellipsometer, optical oxide film converted thickness was 2.1 nm and its uniformity was 6.0%.

What is claimed is:

1. A method for modifying a surface of a substrate to be processed, by utilizing plasma, said method comprising the steps of:

adjusting a temperature of the substrate from 200° C. to 400° C.;

introducing gas including nitrogen atoms or mixture gas including inert gas and the gas including nitrogen atoms into a plasma process chamber;

adjusting pressure in the plasma process chamber above 13.3 Pa;

generating plasma in the plasma process chamber; and injecting ions equal to or smaller than 10 eV in the plasma into the substrate to be processed.

2. A method according to claim 1, wherein said temperature adjusting step adjusts the temperature of the substrate from 200° C. to 300° C.

3. A method according to claim 1, wherein said introducing step introduces $N_2$, $NH_3$ or $N_2H_4$ as the gas including nitrogen atoms.

4. A method according to claim 1, wherein said introducing step introduces He, Ne, Ar, Kr, and Xe as the inert gas.

5. A method according to claim 1, wherein said pressure adjusting step adjusts the pressure between 26.6 Pa and 39.9 Pa.

6. A method according to claim 1, wherein said injecting step injects the ion with an average value of ion energy equal to or smaller than 7 eV.

7. A method according to claim 1, wherein said generating step generates as the plasma surface-wave plasma, surface-wave interference plasma, or RLSA plasma.

8. A method according to claim 1, wherein the surface of the substrate to be processed is a surface of a MOSFET gate insulating film.

* * * * *

UNITED STATES PATENT AND TRADEMARK OFFICE
CERTIFICATE OF CORRECTION

PATENT NO. : 6,916,678 B2
DATED : July 12, 2005
INVENTOR(S) : Hideo Kitagawa et al.

It is certified that error appears in the above-identified patent and that said Letters Patent is hereby corrected as shown below:

Column 6,
Line 1, "is" should read -- 1s --.

Signed and Sealed this

Fifteenth Day of November, 2005

JON W. DUDAS
*Director of the United States Patent and Trademark Office*